(12) United States Patent
Poulsen et al.

(10) Patent No.: US 11,765,823 B1
(45) Date of Patent: *Sep. 19, 2023

(54) SYSTEM-IN-PACKAGE CELLULAR ASSEMBLY

(71) Applicant: Signetik, LLC, Lincoln, NE (US)

(72) Inventors: Steven Poulsen, Lincoln, NE (US); Christopher Lawson, Lincoln, NE (US); Nalini Muppala, Lincoln, NE (US)

(73) Assignee: Signetik, LLC, Lincoln, NE (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/825,765

(22) Filed: May 26, 2022

Related U.S. Application Data

(63) Continuation of application No. 17/154,973, filed on Jan. 21, 2021, now Pat. No. 11,357,103.

(60) Provisional application No. 62/963,745, filed on Jan. 21, 2020.

(51) Int. Cl.
| | |
|---|---|
| *H05K 1/14* | (2006.01) |
| *H05K 1/02* | (2006.01) |
| *H01R 12/70* | (2011.01) |
| *H01R 12/71* | (2011.01) |
| *H05K 1/11* | (2006.01) |

(52) U.S. Cl.
CPC ....... *H05K 1/0298* (2013.01); *H01R 12/7076* (2013.01); *H01R 12/716* (2013.01); *H05K 1/115* (2013.01); *H05K 1/141* (2013.01); *H05K 1/144* (2013.01); *H05K 2201/10098* (2013.01); *H05K 2201/10106* (2013.01); *H05K 2201/10189* (2013.01)

(58) Field of Classification Search
CPC ...... H05K 1/0298; H05K 1/115; H05K 1/141; H05K 1/144; H05K 2201/10098; H05K 2201/10106; H05K 2201/10189; H05K 2201/042; H05K 1/145; H05K 1/14; H05K 2201/041; H01R 12/7076; H01R 12/716

See application file for complete search history.

(56) References Cited

U.S. PATENT DOCUMENTS

| | | | |
|---|---|---|---|
| 6,325,636 B1 * | 12/2001 | Hipp | ............ G06F 1/183 361/788 |
| 6,344,972 B2 | 2/2002 | Estieule et al. | |
| 9,838,066 B2 | 12/2017 | Larson et al. | |

(Continued)

*Primary Examiner* — Steven T Sawyer
(74) *Attorney, Agent, or Firm* — Suiter Swantz pc llo

(57) ABSTRACT

A system-in-package cellular assembly is disclosed. The assembly may include a main board including a multi-layer printed circuit board. The main board may include one or more through holes and be detachably connectable to an end-product via the one or more through holes and one or more connecting members. The main board may be reversibly, electrically couplable to the end-product via the one or more through holes and the one or more connecting members. The assembly may include an add-on board including one or more through holes and be detachably connectable to the main board via one or more connectors. The add-on board may be reversibly, electrically couplable to the main board via one or more main board surface mount connectors and one or more add-on board surface mount connectors. The add-on board may include at least one of one or more sensors or one or more sensor through holes.

11 Claims, 10 Drawing Sheets

(56) References Cited

U.S. PATENT DOCUMENTS

| | | | |
|---|---|---|---|
| 2002/0048498 A1* | 4/2002 | Bartels | F16B 33/008 |
| | | | 411/171 |
| 2003/0112608 A1 | 6/2003 | Takami et al. | |
| 2013/0140541 A1* | 6/2013 | Kunz | H01L 27/3225 |
| | | | 438/23 |
| 2014/0279565 A1 | 9/2014 | Trump et al. | |
| 2015/0185768 A1 | 7/2015 | Voege et al. | |
| 2015/0245487 A1* | 8/2015 | Kim | H01L 25/0655 |
| | | | 361/783 |
| 2016/0128179 A1 | 5/2016 | Okamoto et al. | |
| 2016/0290878 A1* | 10/2016 | Severinkangas | A61B 5/1038 |
| 2017/0141809 A1 | 5/2017 | Larson et al. | |
| 2018/0331081 A1* | 11/2018 | Goh | H05K 3/303 |
| 2020/0235608 A1* | 7/2020 | LaFayette | H05K 1/181 |
| 2020/0412042 A1 | 12/2020 | Zhao et al. | |
| 2021/0307189 A1* | 9/2021 | Lucero | H05K 7/1422 |

* cited by examiner

SYSTEM-IN-PACKAGE CELLULAR ASSEMBLY

CROSS-REFERENCE TO RELATED APPLICATIONS

The present disclosure constitutes a continuation application of U.S. patent application Ser. No. 17/154,973, filed Jan. 21, 2021, which is a regular (non-provisional) patent application of U.S. Provisional Application Ser. No. 62/963,745, filed Jan. 21, 2020, whereby each of the above-listed patent applications is incorporated herein by reference in their entirety.

TECHNICAL FIELD

The present disclosure relates to a system-in-package cellular assembly to enable rapid development, prototyping, and reduced time to market.

BACKGROUND

Machine-to-machine (M2M) communications facilitate remote monitoring of devices in a variety of applications and industries. M2M communication devices remain relatively expensive and typically require ample time to develop and get to the market. Additionally, current M2M communication devices may be difficult to customize and may not be designed to be integrated with the latest standards of technology.

Therefore, it would be desirable to provide a system which cures one or more of the shortfalls of previous approaches identified above.

SUMMARY

A system-in-package cellular assembly is disclosed, in accordance with one or more embodiments of the present disclosure. In one embodiment, the system-in-package cellular assembly includes a main board including a multi-layer printed circuit board. In another embodiment, the main board includes one or more main board through holes. In another embodiment, the main board is detachably connectable to an end-product via the one or more main board through holes and one or more end-product connecting members. In another embodiment, the main board is reversibly, electrically couplable to the end-product via the one or more main board through holes and the one or more end-product connecting members. In another embodiment, the main board includes a system-in-package device configured to provide connectivity for the end-product. In another embodiment, the main board includes one or more soldered nuts. In another embodiment, the main board includes one or more main board surface mount connectors. In another embodiment, the system-in-package cellular assembly includes an add-on board including one or more add-on board through holes. In another embodiment, the add-on board is detachably connectable to the main board via one or more connectors configured to couple to the one or more soldered nuts of the main board. In another embodiment, the one or more add-on board through holes are configured to receive the one or more connectors. In another embodiment, the add-on board is reversibly, electrically couplable to the main board via one or more add-on board surface mount connectors configured to couple to the one or more main board surface mount connectors. In another embodiment, the add-on board includes at least one of one or more sensors or one or more sensor through holes configured to couple to one or more additional sensors.

A main board assembly is disclosed, in accordance with one or more embodiments of the present disclosure. In one embodiment, the main board assembly includes a multi-layer printed circuit board. In another embodiment, the main board assembly includes one or more through holes configured to receive one or more end-product connecting members. In another embodiment, the main board assembly includes a system-in-package device configured to provide connectivity for an end-product. In another embodiment, the main board assembly includes one or more soldered nuts. In another embodiment, the main board assembly includes one or more surface mount connectors.

An add-on board assembly is disclosed, in accordance with one or more embodiments of the present disclosure. In one embodiment, the add-on board assembly includes one or more coupling assemblies. In another embodiment, the add-on board assembly includes one or more surface mount connectors. In another embodiment, the add-on board assembly includes at least one of one or more sensors or one or more sensor through holes configured to couple to one or more additional sensors.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION

Figure 1:
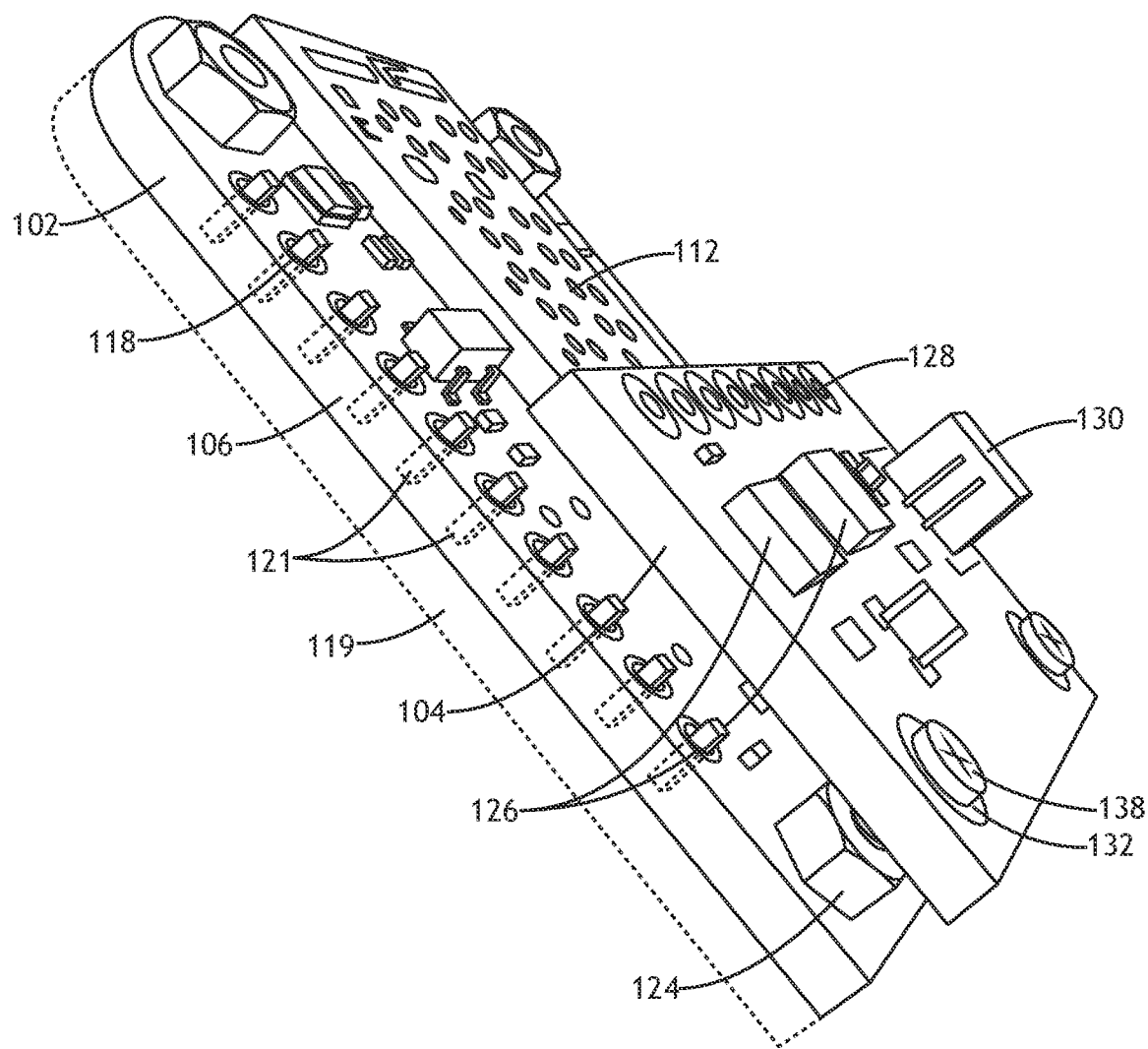
FIG. 1 illustrates a bottom perspective view of a system-in-package (SiP) cellular assembly, in accordance with one or more embodiments of the present disclosure.

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

The present disclosure relates to a system-in-package (SiP) cellular assembly for use in an end-product (e.g., agriculture, gas and oil, building management, healthcare/medical devices, vending machines, dispensing machines, asset tracking, environmental sensing, animal health, payment processing, artificial intelligence (AI), computer vision (CV), weather monitoring, sound monitoring, industrial monitoring, inventory control, or the like). For example, the SiP cellular assembly may be used in an agricultural end-product to measure farm sensors. By way of another example, the SiP cellular assembly may be used in a gas and oil end-product to measure gas and oil machine information such as, but not limited to, speed of a drill, heat of a drill, or the like. By way of another example, the SiP cellular assembly may be used in a gas and oil end-product to control one or more components of the gas and oil machine end-product such as turning on gas/oil drilling rigs, or the like. By way of another example, the SiP cellular assembly may be used in a building management end-product to measure temperature, humidity, containment levels, and the like. By way of another example, the SiP cellular assembly may be used in a building management end-product to control one or more components of the building management end-product such as turning on a fan in the building, or the like. By way of another example, the SiP cellular assembly may be used in healthcare/medical devices to measure healthcare/medical data. By way of another example, the SiP cellular assembly may be used in vending machines to measure vending machine levels, money levels, or detect problems. By way of another example, the SiP cellular assembly may be used in dispensing machines (e.g., soap dispensers) to measure liquid/gel levels and obtain usage information.

Embodiments of the present disclosure are directed to a SiP cellular assembly to enable rapid prototyping, development, and decreased time to market. Embodiments of the present disclosure are also directed to a SiP cellular assembly that requires low power. Embodiments of the present disclosure are also directed to a SiP cellular assembly that includes a customizable add-on board including one or more sensors. The add-on board may be developed rapidly to enable decreased time to market and rapid prototyping. It is noted herein that the term "system-in-package" or "SiP" refers to one or more integrated circuits enclosed in a single chip carrier package.

Reference will now be made in detail to the subject matter disclosed, which is illustrated in the accompanying drawings.

Referring generally to FIGS. 1-10, a system-in-package (SiP) cellular assembly 100 is described, in accordance with one or more embodiments of the present disclosure.

Figure 2:
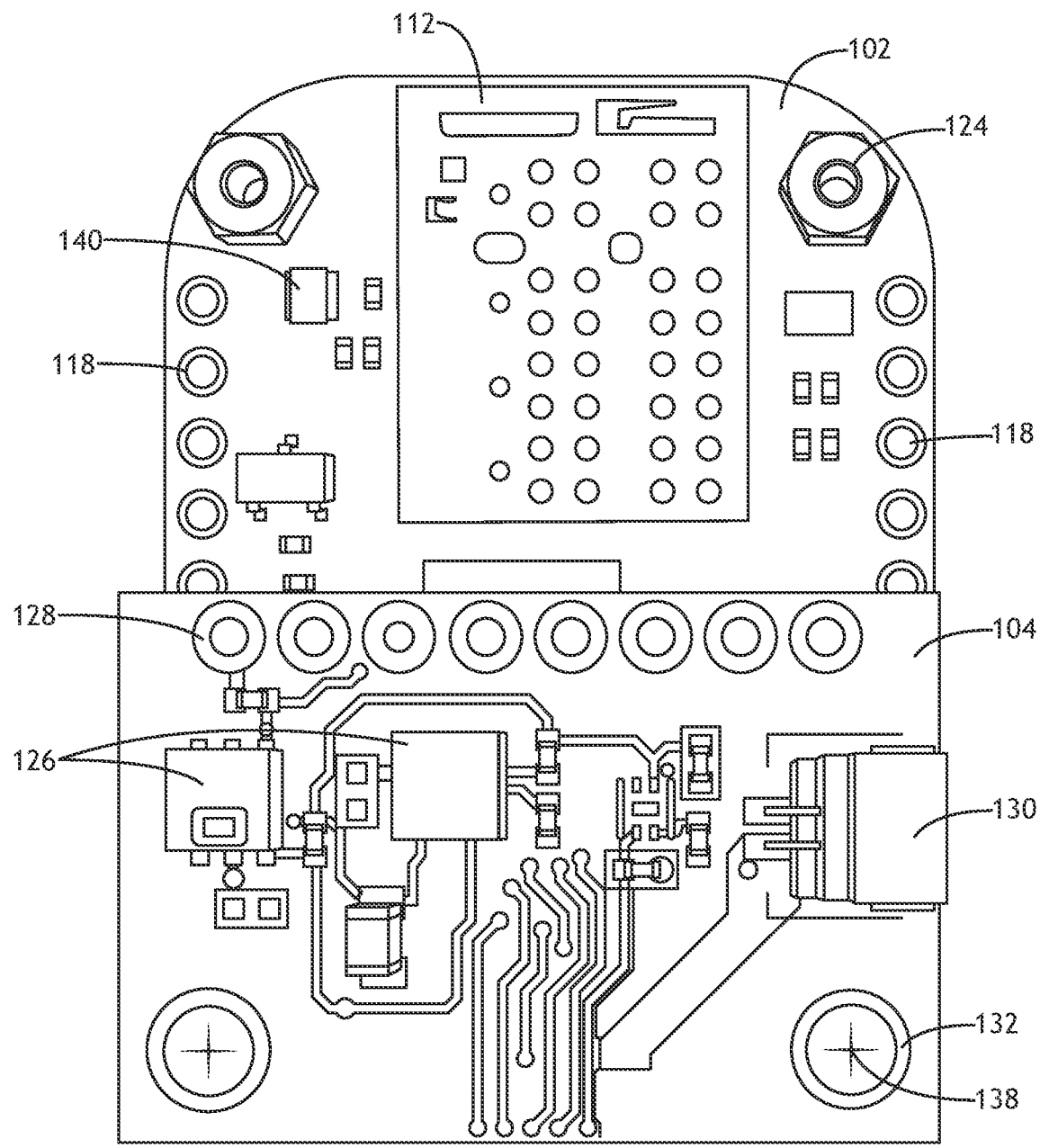
FIG. 2 illustrates a bottom view of the SiP cellular assembly, in accordance with one or more embodiments of the present disclosure.
Figure 3:
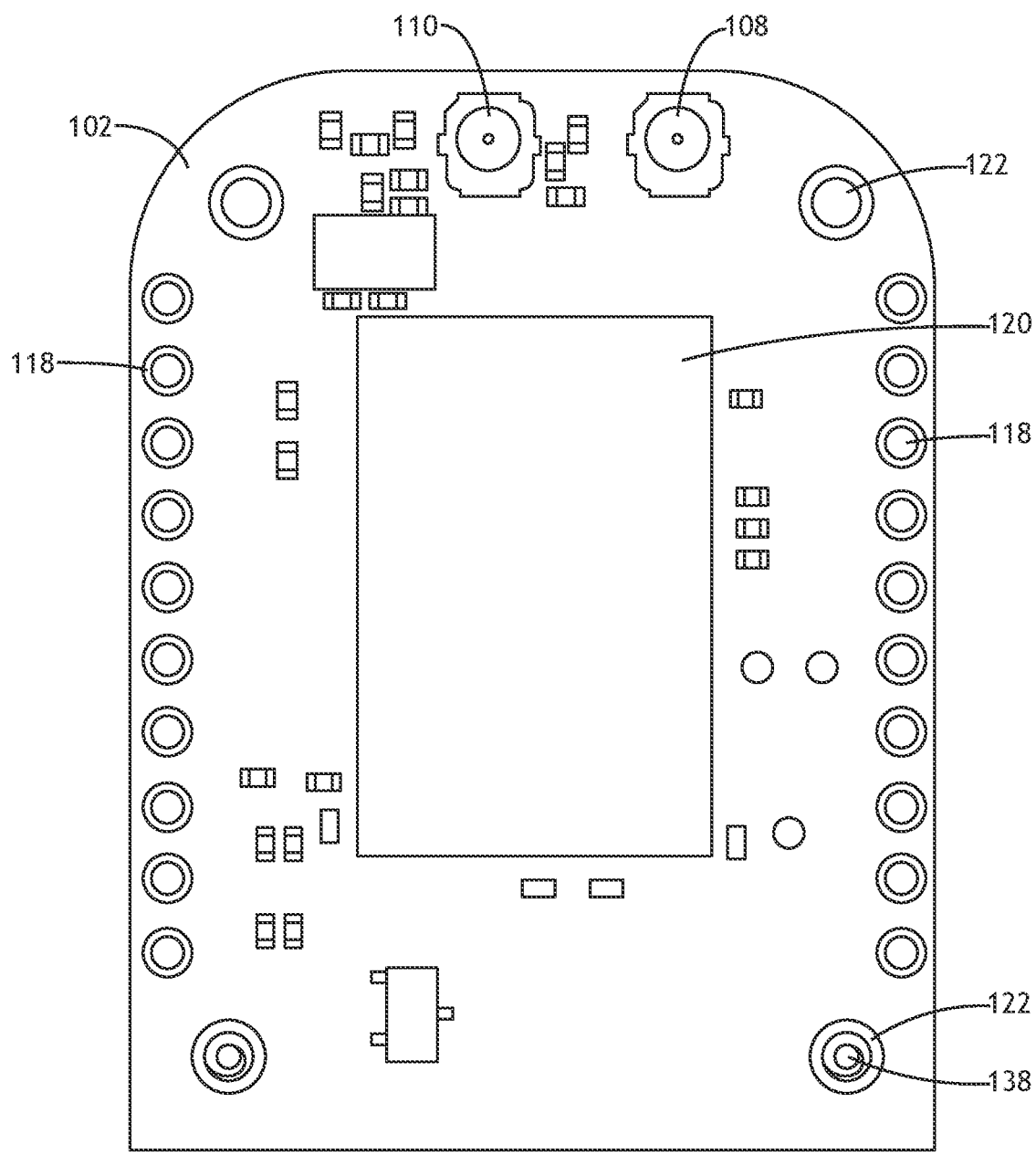
FIG. 3 illustrates a top view of the SiP cellular assembly, in accordance with one or more embodiments of the present disclosure.
Figure 4:
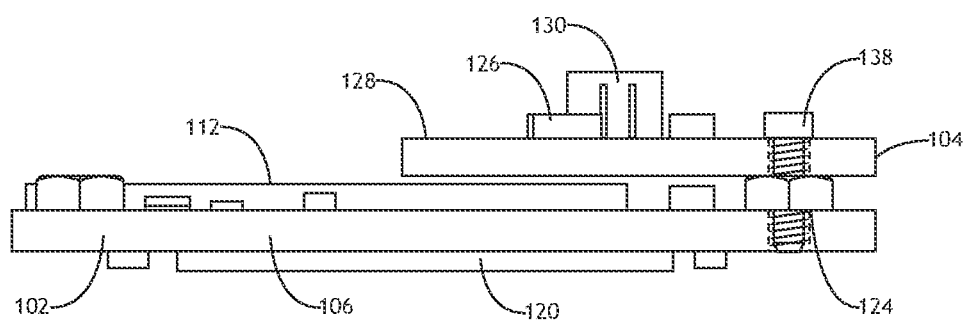
FIG. 4 illustrates a side view of the SiP cellular assembly, in accordance with one or more embodiments of the present disclosure.
Figure 5:
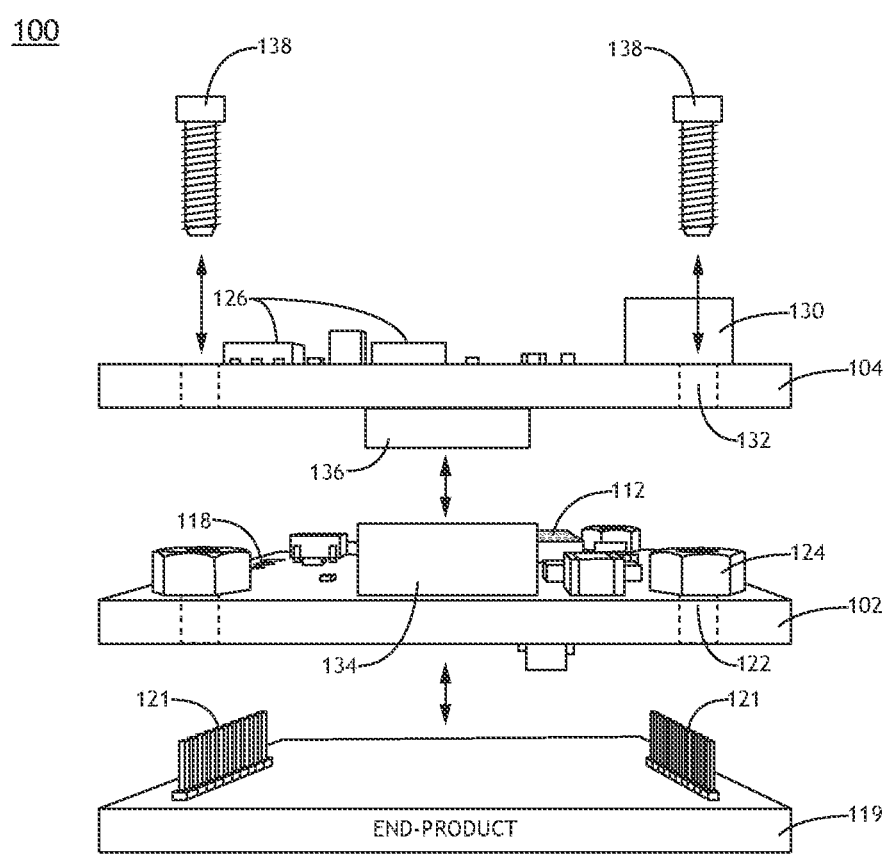
FIG. 5 illustrates an exploded rear view of the SiP cellular assembly, in accordance with one or more embodiments of the present disclosure.

FIGS. 1-5 illustrate the SiP cellular assembly 100, in accordance with one or more embodiments of the present disclosure. In particular, FIG. 1 illustrates a bottom perspective view of the SiP cellular assembly 100, in accordance with one or more embodiments of the present disclosure. In particular, FIG. 2 illustrates a bottom view of the SiP cellular assembly 100, in accordance with one or more embodiments of the present disclosure. In particular, FIG. 3 illustrates a top view of the SiP cellular assembly 100, in accordance with one or more embodiments of the present disclosure. In particular, FIG. 4 illustrates a side view of the SiP cellular assembly 100, in accordance with one or more embodiments of the present disclosure. In particular, FIG. 5 illustrates an exploded rear view of the SiP cellular assembly 100, in accordance with one or more embodiments of the present disclosure.

In one embodiment, a SiP cellular assembly 100 may include, but is not limited to, a main board 102 and an add-on board 104. In another embodiment, the main board 102 is configured to provide at least processing and connectivity capabilities for an end-product. In another embodiment, the add-on board 104 is configured to interface with the physical world to sense various parameters and provide various measurements of the end-product.

In another embodiment, the add-on board 104 is configured to reversibly, electrically couple to a portion of the main board 102. For example, as discussed further herein, the main board 102 may include one or more main board surface mount connectors 134 configured to receive one or more add-on board surface mount connectors 136 of the add-on board 104. In another embodiment, the add-on board 104 is configured to detachably connect to a portion of the main board 102. For example, as discussed further herein, the main board 102 may include one or more soldered nuts 124 configured to couple to one or more connectors 138 of the add-on board 104. In this regard, the add-on board 104 may include one or more through holes 132 configured to receive the one or more connectors 138.

Figure 6:
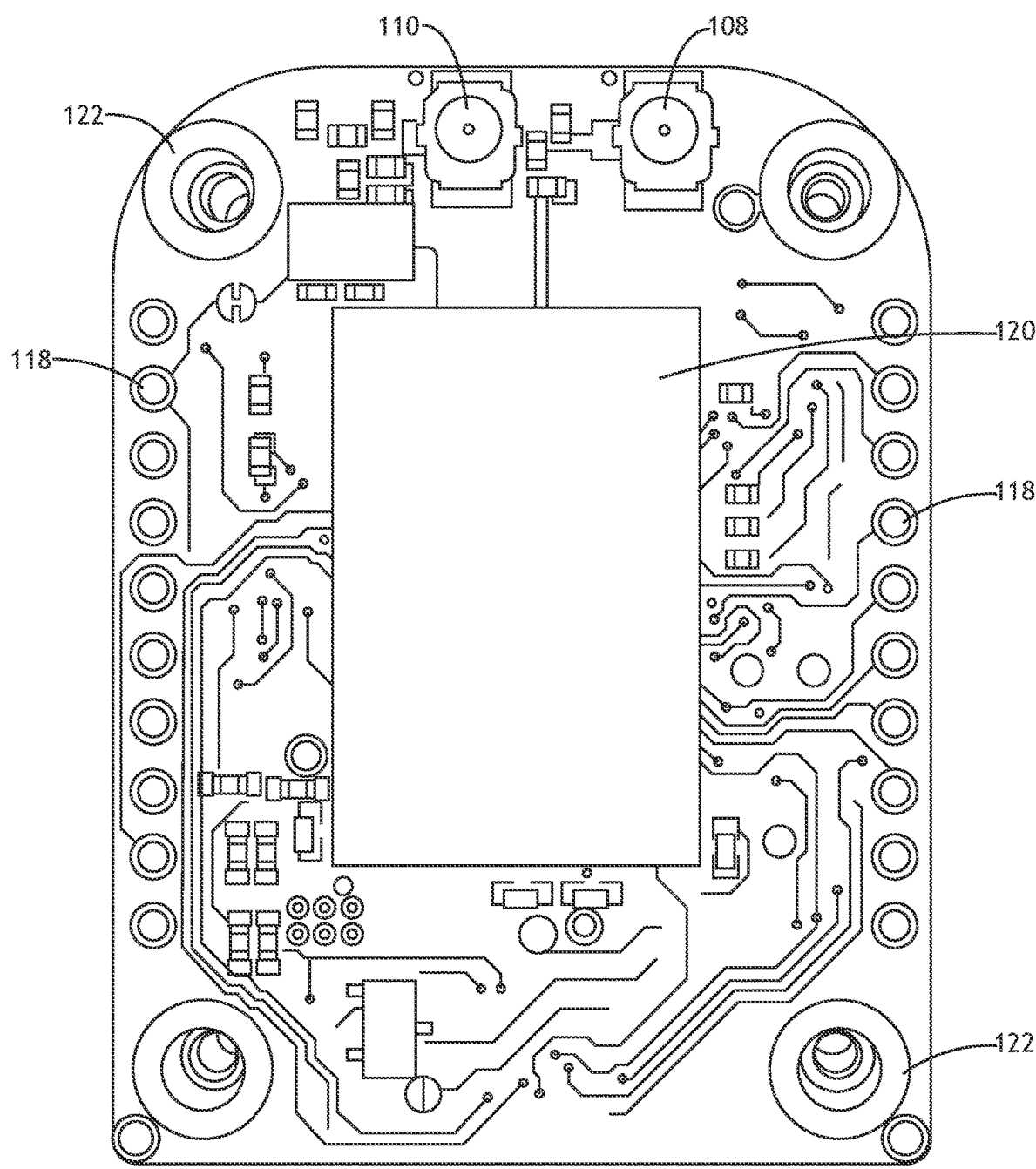
FIG. 6 illustrates a top view of a main board of the SiP cellular assembly, in accordance with one or more embodiments of the present disclosure.
Figure 7:
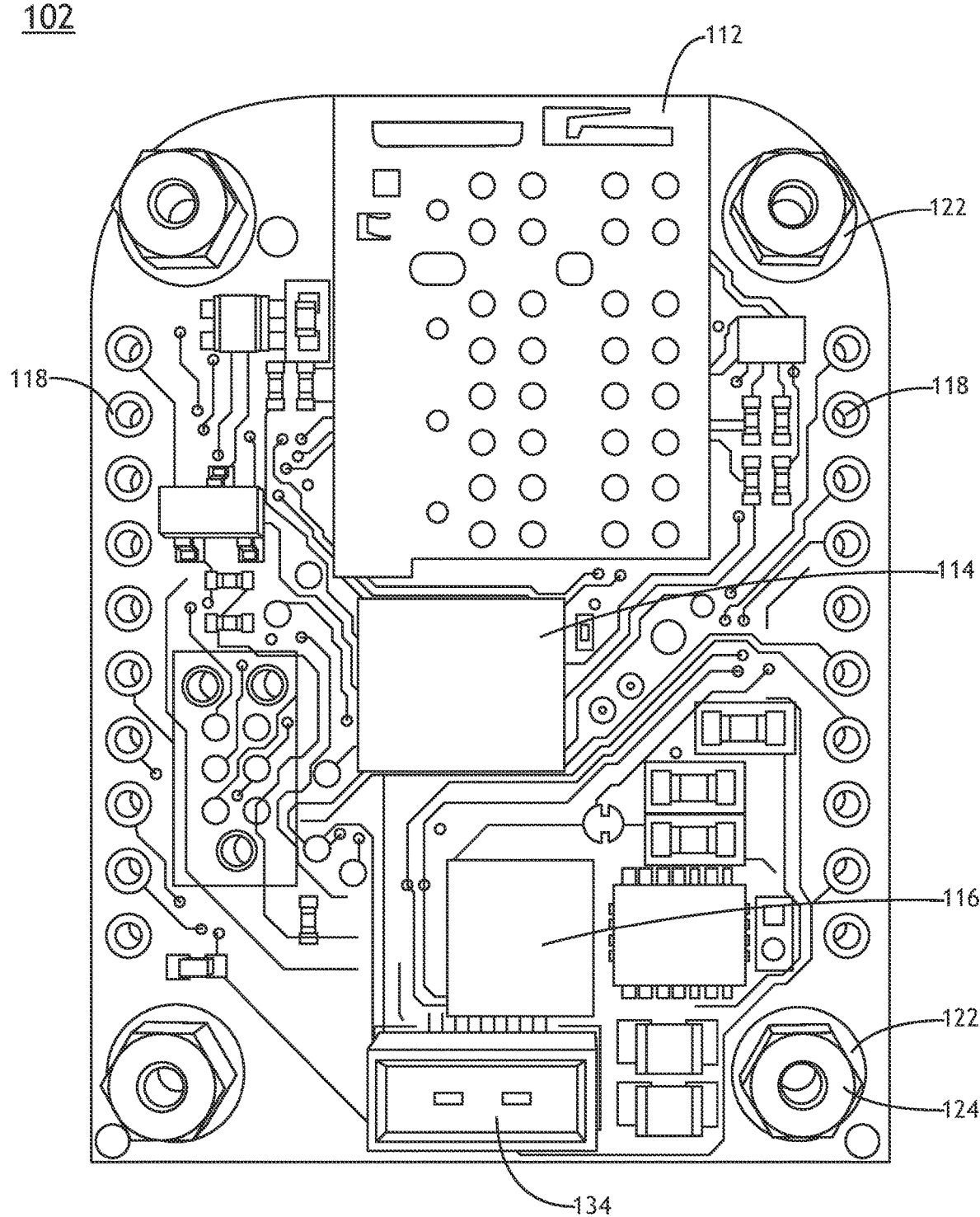
FIG. 7 illustrates a bottom view of the main board of the SiP cellular assembly, in accordance with one or more embodiments of the present disclosure.
Figure 8:
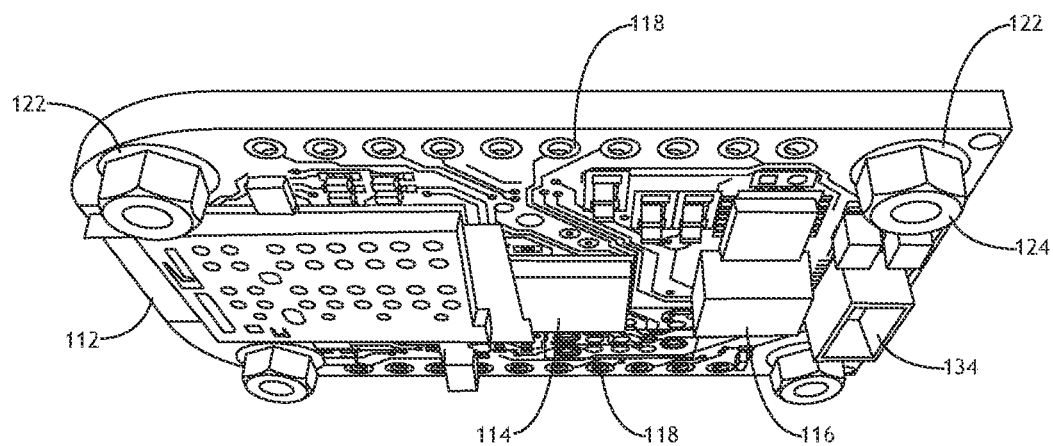
FIG. 8 illustrates a bottom perspective view of the main board of the SiP cellular assembly, in accordance with one or more embodiments of the present disclosure.

FIGS. 6-8 illustrate the main board 102 of the SiP cellular assembly 100, in accordance with one or more embodiments of the present disclosure. In particular, FIG. 6 illustrates a top view of the main board 102 of the SiP cellular assembly 100, in accordance with one or more embodiments of the present disclosure. In particular, FIG. 7 illustrates a bottom view of the main board 102 of the SiP cellular assembly 100, in accordance with one or more embodiments of the present disclosure. In particular, FIG. 8 illustrates a bottom perspective view of the main board 102 of the SiP cellular assembly 100, in accordance with one or more embodiments of the present disclosure.

In one embodiment, the main board 102 of the SiP cellular assembly 100 includes a printed circuit (PC) board 106. In another embodiment, the PC board 106 is a multi-layer board. For example, the multi-layer PC board may include at least four layers. The at least four layers may be electrically coupled to proximate sub-boards within the multi-layer board. For instance, the multi-layer PC board may include a silkscreened and solder-masked top side including a first layer including a circuit topside, a second layer including a ground plane, a third layer including a power plane, a fourth layer including a circuit bottom side, and a silkscreened and solder-masked bottom side. The one or more layers may be formed of a non-semiconductor and/or a semiconductor material. For example, a non-semiconductor or semiconductor material may include, but is not limited to, copper, fiberglass, monocrystalline silicon, gallium arsenide, and indium phosphide. Therefore, the above description should not be interpreted as a limitation on the scope of the present disclosure but merely an illustration.

In another embodiment, the main board 102 includes one or more cell antenna ports 108 arranged on a topside of the main board 102. It is noted herein that the main board 102 may include any type of cell antenna port. For example, the main board 102 may include a U.FL antenna port configured to couple with a micro antenna cable.

In another embodiment, the main board 102 includes one or more location antenna ports 110 arranged on a topside of the main board 102. In another embodiment, the one or more location antenna ports 110 are configured to couple with one or more location systems. For example, the one or more location antenna ports 110 may be configured to couple with, but are not required to couple with, a global positioning system (GPS), a global navigation satellite system (GNSS), a global satellite navigation system (GLONASS) antenna port, or the like. It is noted herein that the main board 102 may include any type of location antenna port. For example, the main board 102 may include a U.FL antenna port configured to couple with a micro antenna cable.

It is noted herein that although FIG. 3 and FIG. 6 depict a single location antenna port 110 (e.g., single GPS port) and a single cell antenna port 108, such depiction is provided merely for illustrative purposes and shall not limit the scope of the present disclosure. For example, the main board 102 may include any number of antenna ports 110, 108 configured to couple to any number of port connectors.

In another embodiment, as shown in FIG. 7, the main board 102 includes one or more subscriber identification module (SIM) card slots 112 arranged on a bottom side of the main board 102. The one or more SIM card slots 112 may include one or more venting holes. In another embodiment, the one or more SIM card slots 112 are configured to receive one or more SIM cards (not shown). The one or more SIM card slots 112 may include any type of SIM card slot suitable for receiving any type of SIM card. For example, the one or more SIM card slots 112 may include one or more standard SIM card slots configured to receive one or standard SIM cards. By way of another example, the one or more SIM card slots 112 may include one or more micro-SIM card slots configured to receive one or more micro-SIM cards. By way of another example, the one or more SIM card slots 112 may include one or more nano-SIM card slots configured to receive one or more nano-SIM cards.

In another embodiment, the main board 102 includes one or more embedded SIM (eSIM) cards 114 arranged on a bottom side of the main board 102. The main board 102 may include any type of eSIM card 114. For example, the main board 102 may include a data only eSIM card 114. By way of another example, the main board 102 may include a Voice, Standard Message Service (SMS), and Data eSIM card 114.

In another embodiment, the main board 102 includes a power regulation device 116 configured to monitor the power of one or more components of the SiP cellular assembly 100.

In some embodiments, as shown in FIGS. 6-8, the main board 102 includes a one or more main board through holes 118. In another embodiment, the one or more through holes 118 are plated with an electrically conductive material. For example, the or more through holes 118 may be plated with copper. It is noted herein that although FIGS. 6-8 depict the one or more through holes 118 as plated through holes, such depiction is provided merely for illustrative embodiments and shall not limit the scope of the present disclosure. For example, the one or more through holes 118 may be non-plated through holes. Further, it is noted herein that the one or more through holes 118 may be fabricated using any through-hole technology (THT) known in the art.

In another embodiment, the one or more through holes 118 are configured to receive one or more connecting members of an end-product device 119, such that the SiP assembly is detachably connectable to the end-product 119 and reversibly, electrically couplable to the end-product 119. For example, the one or more through holes 118 may be configured to receive one or more rows of 10-pin connectors 121. In one instance, a first row of one or more side connector through holes 118 may be configured to receive a first row of 10-pin connectors 121. In another instance, a second row of one or more side connector through holes 118 may be configured to receive a second row of 10-pin connectors 121. In this regard, the SiP cellular assembly 100 is configured for backward compatibility, such that the one or more through holes 118 may be configured to receive any type of connecting member on any type of end-product. It is noted herein that the backward compatibility of the SiP cellular assembly 100 allows for interoperability with older systems.

It is noted herein that the main board 102 may be configured for any type of end-product. For example, the end-product may include, but is not limited to, agriculture, gas and oil, building management, healthcare/medical devices, vending machines, dispensing machines, asset tracking, environmental sensing, animal health, payment processing, artificial intelligence (AI), computer vision (CV), weather monitoring, sound monitoring, industrial monitoring, inventory control, or the like. In one instance, the SiP cellular assembly may be used in an agricultural end-product to measure farm sensors. In another instance, the SiP cellular assembly may be used in a gas and oil end-product to measure gas and oil machine information such as, but not limited to, speed of a drill, heat of a drill, or the like. In another instance, the SiP cellular assembly may be used in a gas and oil end-product to control one or more components of the gas and oil machine end-product such as turning on gas/oil drilling rigs, or the like. In another instance, the SiP cellular assembly may be used in a building management end-product to measure temperature, humidity, containment levels, and the like. In another instance, the SiP cellular assembly may be used in a building management end-product to control one or more components of the building management end-product such as turning on a fan in the building, or the like. In another instance, the SiP cellular assembly may be used in healthcare/medical devices to measure healthcare/medical data. In another instance, the SiP cellular assembly may be used in vending machines to measure vending machine levels, money levels, or detect problems. In another instance, the SiP cellular assembly may be used in dispensing machines (e.g., soap dispensers) to measure liquid/gel levels and obtain usage information. It is further noted herein that the SiP assembly 100 may be end device certified such that the time to market may be reduced.

In another embodiment, as shown in FIG. 6, the main board 102 includes a system-in-package (SiP) device 120 arranged on a topside of the main board 102. The SiP device 120 may include any SiP device known in the art such as, but not limited to, a Nordic Semiconductor nRF9160. In another embodiment, the SiP device 120 includes a modem configured to provide connectivity for the SiP cellular assembly 100. For example, the SiP device 120 may include an LTE-M/NB-IoT modem configured to provide LTE-M/NB-IoT connectivity for the SiP cellular assembly 100. It is noted herein that the SiP cellular assembly 100 is not limited to cellular radios and may include any radio known in the art including, but not limited to, WiFi, LoRA, BLE, Zigbee, Z-wave, and the like.

In another embodiment, the SiP device 120 includes a controller. For example, the SiP device 120 may include a microcontroller unit (MCU). In another embodiment, the controller is communicatively coupled to the server via network. In one embodiment, controller includes one or more processors and memory. The controller may include any processor known in the art including, but not limited to, a microprocessor. The controller may include any memory known in the art including, but not limited to, a flash memory or random-access memory (RAM). Therefore, the above description should not be interpreted as a limitation on the scope of the present disclosure but merely an illustration.

In another embodiment, the one or more processors of the SiP device 120 are configured to communicate with at least one of the one or more SIM cards within the one or more SIM card slots 112 or the one or more eSIM cards 114. In another embodiment, the one or more processors of the SiP device 120 are configured to communicate with an end-product.

In another embodiment, the controller includes a network server configured to be used as a data collection point. In another embodiment, the network server is configured to be used as a device management point. In another embodiment, the network server includes a PUSH/PULL application programming interface (API) such that the network server may be used to move data to the final application server.

In another embodiment, the network server is configured to be compatible with firmware on the SiP cellular assembly 100. In another embodiment, the firmware is configured to support messaging via web transfer. For example, the firmware may be configured to support messaging via a constrained application protocol (CoAP). The CoAP may be configured to integrate with concise binary object representation (CBOR), or any data format known in the art. In another embodiment, the firmware is configured to receive over-the-air programming (OTA) updates.

In another embodiment, the main board 102 includes one or more light-emitting diodes (LEDs) 140. The one or more LEDs may be configured to indicate one or more connectivity statuses. For example, the one or more LEDs may be configured to indicate cell tower connection, internet connection, and the like. The one or more LEDs may be further configured to indicate other characteristics of the SiP assembly 100 such as, but not limited to, power, signal strength, transmission and reception of data, or the like. It is noted herein that the one or more LEDs may be configured to blink based on the one or more statuses or other characteristics. Further, it is noted herein that the one or more LEDs may be configured to illuminate based on the one or more statuses or other characteristics.

It is noted herein that the main board 102 may have any dimensions. For example, the main board may have a length between 25-35 mm. For instance, the main board may have a length of 33 mm. By way of another example, the main board may have a width between 20-30 mm. For instance, the main board may have a width of 25 mm. Further, it is noted herein that the small size of the main board allows for the SiP assembly 100 to be utilized in a wide array of end-products.

Referring again to FIGS. 1-5, in one embodiment, the add-on board 104 is reversibly, electrically couplable to the main board 102 via one or more surface mount connectors 134, 136. For example, the main board 102 may include one or more main board surface mount connectors 134 and the add-on board 104 may include one or more add-on board surface mount connectors 136. In this regard, a portion of the one or more surface mount connectors 134 (e.g., one or more pins of the surface mount connector 134) may be configured to couple to a portion of the one or more add-on board surface mount connectors 136 (e.g., one or more pins of the surface mount connector 136), such that when pressed together, the add-on board 104 is reversibly, electrically coupled to the main board 102.

In another embodiment, the add-board 104 is detachably connectable to the main board 102 via one or more connectors 138. For example, the main board 102 may include one or more soldered nuts 124 configured to couple to one or more through holes 122. In this regard, the one or more soldered nuts 124 may be configured to receive one or more connectors 138, such that the add-on board 104 may be detachably connected to the main board 102. The one or more connectors 138 may be any connector known in the art. For example, the one or more connectors 138 may include, but are not required to include, one or more bolts, one or more screws, or the like.

In another embodiment, the add-on board 104 includes one or more coupling assemblies. The one or more coupling assemblies may include one or more add-on board through holes 132 configured to receive the one or more connectors 138. For example, the one or more add-on board through holes 132 and the one or more soldered nuts 124 may be configured to receive the one or more connectors 138, such that the add-on board 104 is detachably coupled to the main board.

In another embodiment, at least one of the add-on board 104 or the main board 102 includes a power entry module (PEM) configured to couple to one or more fasteners (e.g., screws or the like). For example, the add-on board 104 may include a PEM including threads configured to couple to the one or more fasteners such that the add-on board 104 and the main board 102 may be reversibly electrically coupled. By way of another example, the main board 102 may include a PEM including threads configured to couple to the one or more fasteners such that the main board 102 and the add-on board 104 may be reversibly electrically coupled. By way of another example, the main board 102 and the add-on board 104 include one or more PEMs.

In another embodiment, the SiP cellular assembly 100 includes software to support the add-on board 104. For example, the network server of the SiP device 120 may be running on amazon web services (AWS) and configured to support the add-on board 104. For instance, the AWS may be configured to support the customizable add-on board 104 in order to support the end-product.

In another embodiment, an interface between the main board 102 and the add-on board 104 is configurable to provide one or more individual connections including one or more functions (e.g., UART, SPI, I2C, ADC, GPIO, LVDS, custom protocols, or the like).

Figure 9:
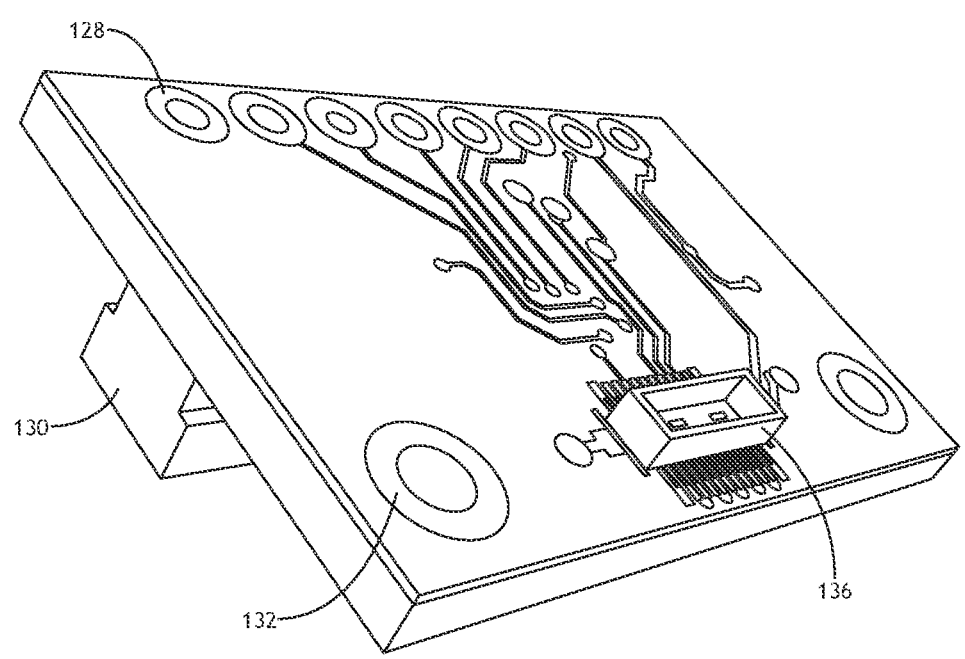
FIG. 9 illustrates a top perspective view of the add-on board of the SiP cellular assembly, in accordance with one or more embodiments of the present disclosure.
Figure 10:
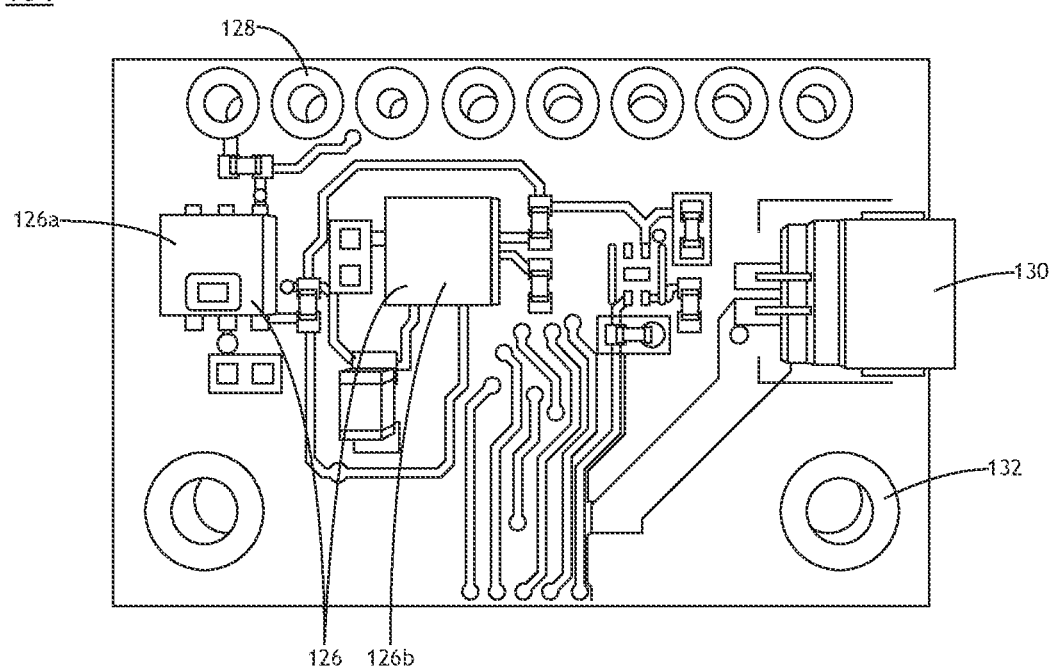
FIG. 10 illustrates a bottom view of the add-on board of the SiP cellular assembly, in accordance with one or more embodiments of the present disclosure.

FIGS. 9-10 illustrate the add-on aboard 104 of the SiP cellular assembly 100, in accordance with one or more embodiments of the present disclosure. In particular, FIG. 9 illustrates a top perspective view of the add-on board 104 of the SiP cellular assembly 100, in accordance with one or more embodiments of the present disclosure. In particular, FIG. 10 illustrates a bottom view of the add-on board 104 of the SiP cellular assembly 100, in accordance with one or more embodiments of the present disclosure.

In one embodiment, as shown in FIG. 10, the add-on board 104 includes one or more sensors 126. The one or more sensors 126 may include any sensor known in the art. For example, the one or more sensors 126 may include a temperature sensor (e.g., thermometer, thermocouple, or the like), an acceleration sensor (e.g., accelerometer or the like), a humidity sensor (e.g., a hygrometer or the like), or the like. For instance, as shown in FIG. 10, the add-on board may include a temperature/humidity sensor 126*a* and an accelerometer 126*b*. It is noted herein the add-on board 104 may be customizable such that a user may customize the one or more sensors 126 such that the add-on board 104 fits the user's needs. Further, it is noted herein the sensor configuration (e.g., location, number, or the like) shown in FIG. 10 is provided merely for illustrative purposes and shall not limit the scope of the present disclosure.

In another embodiment, the add-on board 104 includes one or more add-on board through holes 128 (e.g., one or more outputs). The one or more through holes 128 (e.g., one or more outputs) may be configured to allow for prototyping of additional one or more sensors (not shown). In another embodiment, as shown in FIGS. 8-9, the one or more through holes 128 (e.g., the one or more outputs) are plated with one or more electrically conductive materials, such as, but not limited to, a metal (e.g., copper). It is noted herein that although FIGS. 9-10 depicts 8 through holes 128, such depiction is provided merely for illustrative purposes and shall not be a limitation on the present disclosure. Further, it is noted here that although FIGS. 9-10 depict the through holes 128 as plated through holes, such depiction is provided merely for illustrative purposes and shall not limit the scope of the present disclosure. For example, the one or more through holes 128 may be un-plated.

In another embodiment, the main board 102 is configured to receive commands from the network server to control the one or more sensors 126 on the add-on board 104. In another embodiment, the main board 102 is configured to periodically or pragmatically read the one or more sensors 126 on the add-on board 104 and send received data to the network server.

In another embodiment, the add-on board 104 includes a battery connector 130 arranged on a bottom side of the add-on board 104. In another embodiment, the add-on board 104 is configured to reversibly electrically couple to at least one of the main board 102 or the end-product. For example, the battery connector 130 may be configured to electrically couple to the battery (or power source) of an end-product (not shown). By way of another example, the battery connector 130 may be configured to electrically couple to the battery of the SiP device 120. In another embodiment, the battery connector 130 is configured to electrically couple to the end-product, such that that battery connector 130 is configured to provide power to at least one of the main board 102, the add-on board 104, or the end-product.

It is noted herein that the add-on board 104 may have any dimension. For example, the add-on board 104 may have a length between 15-20 mm. For instance, the add-on board 104 may have a length of 17 mm. By way of another example, the add-on board 104 may have a width between 20-30 mm. For instance, the add-on board may have a width of 25 mm.

Further, it is noted herein that one or more components of the main board 102 and/or the add-on board 104 may be mounted to the main board 102 and/or the add-on board 104 using any fabrication mechanism known in the art. For example, the one or more components (e.g., SiP device, SIM card slot, eSIM card, power regulation, battery connector, antenna, or the like) may be coupled to the main board and/or the add-on board using an electrically conductive adhesive (e.g., epoxy), connector sealing, corner bonding, thermally conductive adhesive (e.g., epoxy), non-conductive die attach (e.g., surface mount device die attach), conductive die attach, conformal coating, or the like.

It is noted herein that the SiP cellular assembly 100 may include a plurality of add-on boards 104 to provide a plurality of functions. For example, an additional add-on board may be electrically coupled to the add-on board 104 (which is coupled to the main board 102) by coupling one or more additional connectors to the one or more through holes 132.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A main board assembly, comprising:
   a multi-layer printed circuit board;
   one or more through holes, wherein the one or more through holes are configured to receive one or more end-product connecting members; a system-in-package device configured to provide connectivity for an end-product, the system-in-package device including a modem, the system-in-package device including a microcontroller unit including one or more processors and a network server, the one or more processors of the system-in-package device configured to communicate with the end-product to provide processing for the end-product, the network server including an application programming interface configured to support an add-on board:
   one or more soldered nuts; and
   one or more surface mount connectors.

2. The assembly of claim 1, wherein the one or more surface mount connectors are coupled to one or more add-on board connectors of the add-on board.

3. The assembly of claim 1, wherein the one or more soldered nuts are coupled to one or more connectors of the add-on board.

4. The assembly of claim 1, further comprising:
   one or more cellular antenna ports.

5. The assembly of claim 1, further comprising:
   one or more location antenna ports.

6. The assembly of claim 1, further comprising:
   one or more subscriber identification module (SIM) card slots configured to receive one or more SIM cards, the one or more processors of the system-in-package device configured to communicate with the one or more SIM cards.

7. The assembly of claim 1, further comprising:
   one or more embedded SIM cards, the one or more processors of the system-in-package device configured to communicate with the one or more embedded SIM cards.

8. The assembly of claim 1, further comprising:
   one or more power regulation devices.

9. The assembly of claim 1, further comprising:
   one or more light-emitting diodes.

10. An add-on board assembly, comprising: one or more coupling assemblies; one or more surface mount connectors coupled to a first side of the add-on board assembly; at least one of one or more sensors coupled to a second side of the add-on board assembly or one or more sensor through holes configured to couple to one or more additional sensors, the one or more sensors and the additional one or more sensors configured to provide sensor data to an end-product by providing the sensor data to a network server of a main board: and one or more battery connectors coupled to the second side of the add-on board assembly; wherein the one or more coupling assemblies include one or more through holes and one or more connectors, wherein the one or more through holes are configured to receive the one or more connectors and wherein the one or more connectors are coupled to one or more soldered nuts of the main board.

11. The assembly of claim 10, wherein the one or more surface mount connectors are coupled to one or more main board surface mount connectors of the main board.

\* \* \* \* \*